(12) United States Patent
de Sousa et al.

(10) Patent No.: US 10,665,526 B2
(45) Date of Patent: May 26, 2020

(54) COMPONENT CARRIER COMPRISING AT LEAST ONE HEAT PIPE AND METHOD FOR PRODUCING SAID COMPONENT CARRIER

(71) Applicant: AT&S Austria Technologie & Systemtechnik Aktiengesellschaft, Leoben (AT)

(72) Inventors: Jonathan Silvano de Sousa, Vienna (AT); Bernhard Reitmaier, Möderbrugg (AT); Erich Schlaffer, St. Lorenzen (AT); Johannes Stahr, St. Lorenzen (AT); Wolfgang Schrittwieser, Kapfenberg (AT); Gerald Weidinger, Leoben (AT); Alexander Kasper, Graz (AT); Gernot Grober, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 157 days.

(21) Appl. No.: 15/721,116

(22) Filed: Sep. 29, 2017

(65) Prior Publication Data

US 2018/0096912 A1 Apr. 5, 2018

(30) Foreign Application Priority Data

Sep. 30, 2016 (EP) .................................... 16191722

(51) Int. Cl.
*H01L 23/427* (2006.01)
*H05K 1/02* (2006.01)
(Continued)

(52) U.S. Cl.
CPC ............ *H01L 23/427* (2013.01); *F21V 29/51* (2015.01); *F28D 15/0275* (2013.01);
(Continued)

(58) Field of Classification Search
CPC ... H01L 23/427; H01L 21/673; H01L 23/473; F21V 29/51; F28D 15/0275;
(Continued)

(56) References Cited

U.S. PATENT DOCUMENTS 4,921,041 A * 5/1990 Akachi .................. F28D 15/00
165/104.14
7,543,374 B2 6/2009 Nakamura
(Continued)

FOREIGN PATENT DOCUMENTS

JP 03255690 11/1991
JP 06181396 6/1994
(Continued)

OTHER PUBLICATIONS

Extended European Search Report for European Application No. 16191722.4, Search completed Mar. 13, 2017, dated Mar. 20, 2017, 8 Pgs.
(Continued)

*Primary Examiner* — Justin M Jonaitis
(74) *Attorney, Agent, or Firm* — KPPB LLP

(57) ABSTRACT

The invention refers to a component carrier comprising at least one heat pipe, wherein the at least one heat pipe has at least a largely cylindrical heat pipe section with a largely cylindrical profile with an outer diameter. The at least one heat pipe is embedded within a recess of at least one inner layer or is surface-mounted on an outer layer of said component carrier, wherein at least the largely cylindrical heat pipe section of the heat pipe is thermoconductively coupled by means of at least one adapter means that directly contacts the heat pipe with at least one layer of the component carrier. Furthermore the invention refers to several methods for producing said component carrier.

12 Claims, 7 Drawing Sheets

(51) Int. Cl.
  *F21V 29/51* (2015.01)
  *F28D 15/02* (2006.01)
  *F28D 20/02* (2006.01)
  *F28F 3/08* (2006.01)
  *H01L 21/673* (2006.01)

(52) U.S. Cl.
  CPC ............ *F28D 20/023* (2013.01); *F28F 3/086* (2013.01); *H01L 21/673* (2013.01); *H05K 1/0203* (2013.01); *H05K 1/0207* (2013.01); *H05K 1/0272* (2013.01); *H05K 1/0206* (2013.01); *H05K 2201/064* (2013.01)

(58) Field of Classification Search
  CPC .................................................. F28D 20/023; F28D 2021/0029; F28F 3/086; F28F 9/013
  USPC ........................ 165/80.4, 177, 178, 168, 170
  See application file for complete search history.

(56) References Cited

U.S. PATENT DOCUMENTS

| | | |
|---|---|---|
| 2002/0054480 A1 | 5/2002 | Jitaru |
| 2003/0066638 A1* | 4/2003 | Qu ........................... F24S 10/90 165/186 |
| 2003/0164549 A1 | 9/2003 | Nakayama |
| 2003/0197285 A1 | 10/2003 | Strandberg et al. |
| 2004/0070946 A1 | 4/2004 | Matsuo et al. |
| 2004/0118553 A1* | 6/2004 | Krassowski .......... C04B 41/009 165/104.26 |
| 2004/0217466 A1 | 11/2004 | Lin |
| 2005/0135061 A1* | 6/2005 | Kiley ................. F28D 15/0266 361/700 |
| 2005/0135062 A1* | 6/2005 | Kiley ................. F28D 15/0266 361/700 |
| 2005/0231983 A1* | 10/2005 | Dahm ................. A61C 19/003 362/294 |
| 2006/0082972 A1* | 4/2006 | Kim ...................... H01L 23/427 361/709 |
| 2007/0064396 A1* | 3/2007 | Oman ................... H01L 23/427 361/700 |
| 2009/0250807 A1 | 10/2009 | Lim et al. |
| 2010/0213601 A1 | 8/2010 | Smeys et al. |
| 2011/0018123 A1 | 1/2011 | An et al. |
| 2011/0069448 A1 | 3/2011 | Weichslberger et al. |
| 2012/0092109 A1* | 4/2012 | Chartouni ........... F28D 15/0233 336/55 |
| 2014/0192480 A1 | 7/2014 | Winkler et al. |
| 2014/0226284 A1* | 8/2014 | Yamauchi ............... C23C 24/04 361/722 |
| 2014/0291866 A1 | 10/2014 | Ooi et al. |
| 2017/0167799 A1* | 6/2017 | Silvano de Sousa ........ F28D 15/0275 |
| 2017/0359889 A1 | 12/2017 | Park |

FOREIGN PATENT DOCUMENTS

| | | |
|---|---|---|
| JP | 2000138485 A | 5/2000 |
| JP | 2000304476 A | 11/2000 |
| JP | 2007043064 A | 2/2007 |
| JP | 2012182159 A | 9/2012 |
| WO | 2007061190 A1 | 5/2007 |
| WO | 2007096313 A1 | 8/2007 |
| WO | 2010121230 A1 | 10/2010 |
| WO | 2014137749 A1 | 9/2014 |
| WO | 2016071327 A1 | 5/2016 |

OTHER PUBLICATIONS

Extended European Search Report for European Application No. 16173562.6, Search completed Nov. 9, 2016, dated Nov. 16, 2016, 8 Pgs.

\* cited by examiner

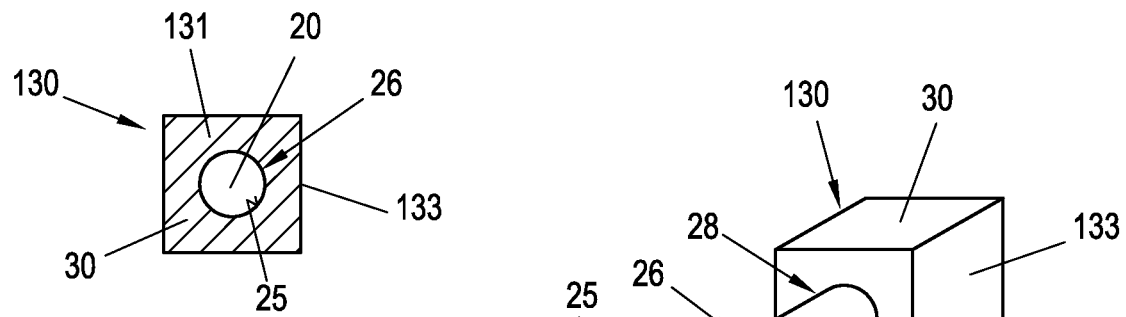
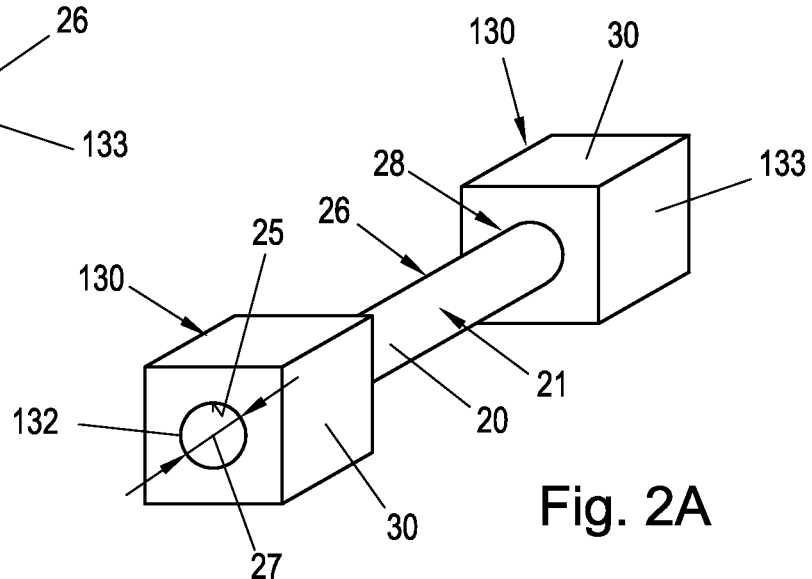
Fig. 1
Fig. 2A
Fig. 2B
Fig. 3B
Fig. 3A
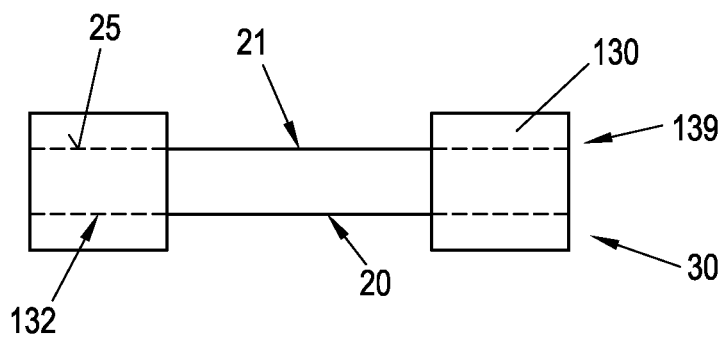
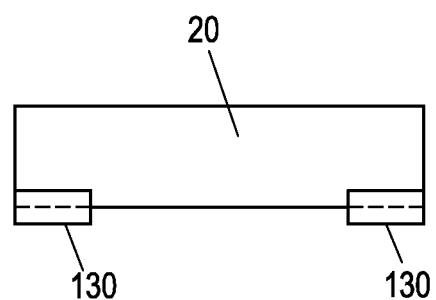
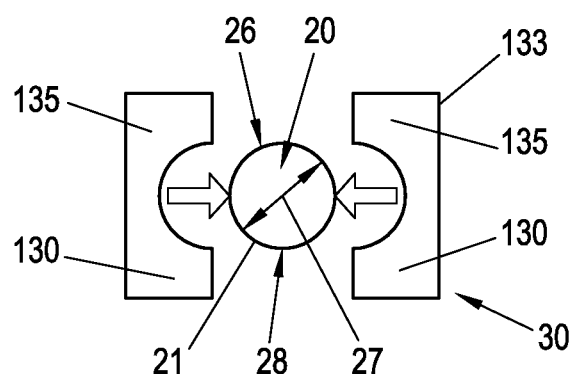

COMPONENT CARRIER COMPRISING AT LEAST ONE HEAT PIPE AND METHOD FOR PRODUCING SAID COMPONENT CARRIER

CROSS REFERENCE TO RELATED APPLICATIONS

This application claims priority to European Application No. 16191722.4 to Jonathan Silvano de Sousa et al. filed on Sep. 30, 2016, the disclosure of which is hereby incorporated by reference in its entirety.

FIELD OF THE INVENTION

The invention relates to a component carrier comprising at least one heat pipe, wherein the at least one heat pipe has at least a largely cylindrical heat pipe section with a largely cylindrical profile with an outer diameter. Furthermore the invention refers to several methods for producing said component carrier.

A component carrier according to the invention can be for example a printed circuit board, an intermediate printed circuit board product or an IC-substrate, wherein the at least one heat pipe is surface-mounted and/or embedded for appertaining cooling of heat-dissipating electronic components. The component carrier is applicable to, but not just limited to electronic devices.

BACKGROUND OF THE INVENTION

A heat pipe is a heat-transfer device that combines the principles of both thermal conductivity and phase transition to efficiently manage the transfer of heat between two solid interfaces. At a hot interface of the heat pipe a heat transfer fluid like a liquid that is in contact with a thermally conductive solid surface turns into a vapour by absorbing heat from that surface. The heat transfer fluid is housed within a cavity of the heat pipe that is usually an encapsulated, closed hollow space to avoid any losses of the heat transfer fluid. The vapour then travels along the heat pipe to a cold interface and condenses there back into a liquid by release of the latent heat. The liquid then returns to the hot interface through either capillary action, centrifugal force, or gravity, and the cycle repeats.

SUMMARY OF THE INVENTION

Many embodiments of the invention are direct to a component carrier (1) having at least one heat pipe (20), wherein the at least one heat pipe (20) has at least a largely cylindrical heat pipe section (25) with a largely cylindrical profile (26) with an outer diameter (27), characterized in that the at least one heat pipe (20) is embedded within a recess (50) of at least one inner layer (10, 12, 13, 14, 19) or is surface-mounted on an outer layer (10, 15) of said component carrier (1), wherein at least the largely cylindrical heat pipe section (25) of the heat pipe (20) is thermoconductively coupled by at least one adapter means (30, 130, 230, 330) that directly contacts the heat pipe (20) with at least one layer (10, 12, 13, 14, 15, 19) of the component carrier (1).

In further embodiments, the at least one adapter means (30, 130, 230, 330) at least partly encloses, preferably completely surrounds, the perimeter (28) of the at least one largely cylindrical heat pipe section (25).

In more embodiments, the adapter means (30, 130, 230, 330) extensively abuts on at least one planar layer (10, 11, 12, 13, 14, 15, 19) of the component carrier (1).

In even further embodiments, the at least one adapter means (30, 130, 230, 330) is positively connected and/or firmly bonded with the at least one largely cylindrical heat pipe section (1).

In even more embodiments, the at least one adapter means (30, 130) is made of a solid metal, preferably made of solid copper, direct bonded copper or an insulated metal substrate (139).

In even further more embodiments, the at least one adapter means (30, 130) is a solid adapter means (130) made in one piece (131) wherein an adapter through-hole (132) is designed to receive at least one largely cylindrical heat pipe section (25) and to surround the perimeter (28) of said cylindrical heat pipe section (25).

In even further more embodiments, the at least one adapter means (30, 130) is a solid adapter means (130) made of several parts (135) that are designed to go together and to jointly receive and surround the perimeter (28) of the at least one largely cylindrical heat pipe section (25).

In even further more embodiments, the at least one adapter means (30, 230) is a paste-like adapter means (230) made of a sinter paste (235) containing metal particles, preferably containing copper- and/or silver-particles.

In even further more embodiments, the at least one adapter means (30, 330) is a resin-like adapter means (330) provided by an excess of epoxy resin (335) that is abundant within the only partially cured layers (10, 100) made of B-stage pre-preg material.

Many embodiments of the invention are directed to a method for producing a component carrier (1) with at least one embedded heat pipe (20), having the following process steps:

—a—Providing at least one heat pipe (20) that comprises at least a largely cylindrical heat pipe section (25) with a largely cylindrical profile (26) with an outer diameter (27);

—b—Optionally providing at least one solid adapter means (30, 130) that can be positively connected and/or firmly bonded with the at least one largely cylindrical heat pipe section (25) in such a way to at least partly enclose, preferably completely surround, the perimeter (28) of the at least one largely cylindrical heat pipe section (25);

and alternatively

—c—Providing at least one inner layer (10, 12, 13, 14) or a temporary carrier layer (40) to position thereupon said at least one heat pipe (20);

—d—Embedding said at least one heat pipe (20) by positioning at least one further inner layer (10, 12, 13, 14, 19) flanking the at least one heat pipe (20) and forming a recess (50) in the shape of the outer contour (21) of said at least one heat pipe (20), wherein if applicable the at least one solid adapter means (30, 130) is in contact with at least one inner layer (10, 12, 13, 14, 19);

or

—c'—Providing at least one inner layer (10, 12, 13, 14, 19) with a recess (50) in the shape of the outer contour (21) of said at least one heat pipe (20);

—d'—Embedding said at least one heat pipe (20) within the recess (50), wherein if applicable the at least one solid adapter means (30, 130) is in direct contact with at least one inner layer (10, 12);

and furthermore

—e—Optionally providing at least one paste-like adapter means (30, 230) to fill up the recess (50) with the at least one embedded heat pipe (20);

—f—Attaching at least one further inner layer (10, 12, 14, 19) to cover the recess (50) with the at least one embedded heat pipe (20);

—g—Optionally attaching outer layers (10, 15) on the recess (50) or on the outsides of the already attached further inner layers (10, 12, 13, 14, 19) covering the at least one embedded heat pipe (20);

—h—Laminating the at least one inner layer (10, 12, 13, 14, 19) with the at least one embedded heat pipe (20) and if applicable the attached outer layers (10, 15), whereby if applicable an excess of epoxy resin (335) that is abundant within only partially-cured layers (10, 100) of the component carrier (1) is provided as resin-like adapter means (30, 330) to fill up the recess with the at least one embedded heat pipe (20), to receive a first semi-finished product;

—i—Optionally removing the temporary carrier layer (40);

—j—Arranging at least one opening (60) from an outside surface (16) of at least one outer layer (10, 15) to contact the at least one adapter means (30, 130, 230, 330) and/or the embedded heat pipe (20);

—k—Connecting the outer layers (10, 15) with the embedded heat pipe by means of thermal vias (70) that are arranged in at least one opening.

In further embodiments, the at least one embedded heat pipe (20) is fixed in place within the recess (50) by adhesive means (80) and after curing the adhesive a paste-like adapter means (30, 230) is applied on top of the heat pipe (20) before at least one further layer (10, 12, 13, 14, 15, 19) is attached to cover the recess (50) with the at least one embedded heat pipe (20).

In more embodiments, a recess (50) with a therein embedded heat pipe (20), which recess (50) is flanked by only partially-cured layers (10, 100) made of B-stage pre-preg material, said recess (50) is covered before lamination (200) by another layer (10, 12, 15), preferably a pressure compensation layer (18) made of a malleable material.

Many embodiments of the invention are directed to a method for producing a component carrier (1) with at least one surface-mounted heat pipe (20), having the following process steps:

—a—Providing at least one heat pipe (20) that comprises at least a largely cylindrical heat pipe section (25) with a largely cylindrical profile (26) with an outer diameter (28);

—b—Optionally providing at least one solid adapter means (30, 130) that can be positively connected and/or firmly bonded with the at least one largely cylindrical heat pipe section (25) in such a way to at least partly enclose, preferably completely surround, the perimeter (28) of said cylindrical heat pipe section (25);

—c—Providing an outer layer (10, 15) to position thereupon said at least one heat pipe (20);

—d—Optionally providing at least one paste-like adapter means (30, 230) and positioning said paste-like adapter means (30, 230) on outside surface sections (17) of the outer layer (10, 15);

—e—Positioning of a centering template (90) on the outer layer (10, 15) if applicable sideways of the paste-like adapter means (30, 230) on surface sections (17) of the outer layer (10, 15);

—f—Positioning of the at least one heat pipe (20), if applicable together with the solid adapter means (30, 130) connected therewith, by means of the centering template (90) on the outer layer (10, 15);

—g—Optionally fixing of the at least one heat pipe (20) in place;

—h—Removing the centering template (90).

In further embodiments, the following sequence of process steps that succeeds after removal of the centering template (90):

—i—Embedding said at least one heat pipe (20) by positioning at least one further inner layer (10, 12, 13, 14, 19) flanking the at least one heat pipe (20) and forming a recess (50) in the shape of the outer contour (21) of said at least one heat pipe (20), wherein if applicable the at least one solid adapter means (30, 130) is in contact with at least one inner layer (10, 12, 13, 14, 19);

—j—Optionally providing at least one paste-like adapter means (30, 230) to fill up the recess (50) with the at least one embedded heat pipe (20);

—k—Attaching at least one further inner layer (10, 12, 13, 14, 19) to cover the recess (50) with the at least one embedded heat pipe (20);

—l—Optionally attaching outer layers (10, 15) on the recess (50) or on the outsides of the already attached further inner layers (10, 12, 13, 14, 19) covering the at least one embedded heat pipe (20);

—m—Laminating (200) the at least one inner layer (10, 12, 13, 14, 19) with the at least one embedded heat pipe (20) and if applicable the attached outer layers (10, 15), whereby if applicable an excess of epoxy resin (335) that is abundant within only partially-cured layers (10, 100) made of B-stage pre-preg material is provided as resin-like adapter means (30, 330) to fill up the recess (50) with the at least one embedded heat pipe (20);

—n—Arranging at least one opening (60) from an outside surface (16) of at least one outer layer (10, 15) to contact the at least one adapter means (30, 130, 230, 330) and/or the embedded heat pipe (20);

—o—Connecting the outer layers (10, 15) with the embedded heat pipe (20) by means of thermal vias that are arranged in at least one opening (60).

BRIEF DESCRIPTION OF THE DRAWINGS

Other objects, advantages and novel features of the present invention will become more apparent from the following detailed description when taken in conjunction with the accompanying schematic drawings.

FIG. 1 shows in a cross-sectional view a detail of a heat pipe with a cylindrical profile and an adapter means that surrounds the heat pipe's cylindrical section.

FIG. 2A shows in an isometric view a detail of a heat pipe with a cylindrical profile and with cubical solid adapter means that are put on cylindrical sections on both ends of the heat pipe.

FIG. 2B shows the heat pipe according to FIG. 2A in a partially cross-sectional side view.

FIG. 3A shows in an exploded side view another embodiment of a solid adapter means that is made of two separate parts to surround the perimeter of a heat pipe's cylindrical section.

FIG. 3B shows in a side view a largely cylindrical heat pipe having thermoconductive adapter means, mounted for instance by welding, partially surrounding the heat pipe.

DETAILED DESCRIPTION

Figure 3C:
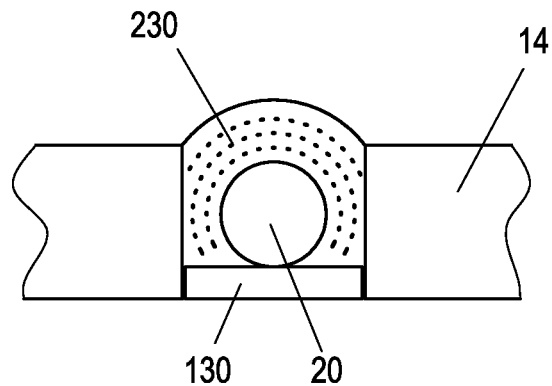
FIG. 3C shows a frontal view of the heatpipe 20 according to FIG. 3B, wherein the heat pipe is placed in a recess, which is optionally filled up with heat conductive material.

Nowadays heat pipes with cylindrical structures are commonly used in industry to improve the thermal management performance of electronic devices. Unfavourably these essentially cylindrical heat pipes have drawbacks in regard to handling during manufacture as well as to bonding capacity due to their essentially cylindrical outer contour and their circular profile, respectively. Thus precise alignment of cylindrical heat pipes is time-consuming and costly as these heat pipes can easily shift out of place before being fixated on a respective position or layer of a component carrier. Due to small support surfaces of these cylindrical heat pipes also heat conductivity as well as electric conductivity are comparatively poor.

To overcome the aforesaid disadvantages of heat pipes conceived with cylindrical structures, they are flattened during the heat pipe fabrication process. For example documents WO 2007/096313 A1 as well as WO 2010/121230 A1 both refer to previously cylindrical heat pipes for cooling that have been deformed to receive a more or less planar shape. Disadvantageously the deforming step to flatten a previously cylindrical heat pipe is an additional manufacturing step with a high default rate due to broken or excessively deformed heat pipes.

Document JP 2000-138485 A discloses a printed circuit board with a heat pipe for cooling electronic components. The heat pipe is integrally formed in a ground plane of one internal metal layer while printed circuit board (short PCB) manufacture, wherein two sheets of copper plates are pressed together in a way that these two compressed copper plates form a cavity that is afterwards filed with a coolant. Disadvantageously the position of this integrally formed heat pipe is predefined by the arrangement of the ground plane metallic layer within the PCB layers. Thus the electronic components are mounted sidewise in a distance to the heat pipe. Also the manufacture of these heat pipes is costly and further enhances thermal stress for the PCB setup as the copper plates have to be pressed together in situ during PCB manufacture.

Flattened heat pipes that are known in the art are small enough to be embedded in a printed circuit board structure. Nevertheless, the maximum temperature range for assembly and operation of these heat pipes usually has to be kept below 140° C. in order not to destroy the heat pipe's flat shape, as an increase of the internal pressure will deform the heat pipe into a more or less cylindrical shape. Disadvantageously this can lead to total failure of the PCB under extreme temperature conditions. Therefore, flattened heat pipes known in the art cannot be assembled on a bare PCB, because high temperatures up to 280° C. that are required for surface mount technology (short: SMT) assembly as well as temperatures up to 250° C. that are required for the subsequent reflow cycles would destroy or at least deform these flattened heat pipes. For that reason, largely cylindrical heat pipes that are robust in regard to extreme temperature changes are usually preferred for the embedding process within a PCB.

It has been found out by the applicant that cylindrical heat pipes can undergo this thermal stress without any reliability risks. Modern cylindrical heat pipes can be as thin as 1 mm in diameter—or even thinner. The challenge that rises in this situation is to properly contact the heat pipes with thermal vias like copper filled vias which are common in PCB technology. The non-planar but cylindrical surface and circular outer shape, respectively, of these heat pipes creates problems in order to safely connect the thermal vias to the surface of the heat pipes to ensure a satisfying heat dissipation ability.

Thus an object of the present invention is to provide an improved component carrier like a PCB, an intermediate printed circuit board product or an IC-substrate, comprising at least one heat pipe with at least a largely cylindrical heat pipe section with a largely cylindrical contour for cooling it, wherein—compared with a known PCB that contains one or several heat pipes—the heat dissipation capacity as well as production handling are enhanced and contact areas to safely connect thermal vias to the heat pipe are arranged in a way to ensure a proper thermal connection between the thermal vias and the heat pipe.

In this context the term "largely cylindrical" in respect to a cylindrical heat pipe section as well as to a cylindrical contour of the heat pipe each concern a more or less cylindrical shape of the heat pipe or at least a respective cylindrical section of said heat pipe. As these heat pipes with a largely cylindrical contour are commodities nowadays, also heat pipes that show slight irregularities and/or minor deviations from a cylindrical shape can be understood and included within the term of largely cylindrical heat pipes. To give examples namely deviations like elliptic deformations of the generally circular profile of said heat pipes or minor deviations from their straight axial directions are incorporated within the term used of a "largely cylindrical" heat pipe or heat pipe section, respectively.

Further on in this context the term "substrate" can be understood as carrier for electrical connections or electrical networks as well as component carrier comparable to a PCB, however with a considerably higher density of laterally and/or vertically arranged connections. Lateral connections are for example conducting paths, whereas vertical connections might be for example drill holes. These lateral and/or vertical connections are arranged within the substrate and are commonly used to provide electrical and/or mechanical connections of components or surrounded components, particularly of IC chips, with a printed circuit board or intermediate printed circuit board. Thus the term "substrate" also includes so-called "IC substrates".

A further object of the present invention is to provide a method for producing a component carrier with at least one embedded or surface-mounted heat pipe with at least a heat pipe section with a largely cylindrical profile, wherein the thermal coupling between the heat pipe and the component carrier is improved and the amount of PCB rejects due to inadequate thermal conduction of the embedded heat pipe is greatly reduced.

In this context the term "component" can be understood as electronic component or electronic chip, respectively. Each active electronic component like a chip, especially a semiconductor chip, or each passive electronic component like a condenser, a resistor, an inductivity or a magnetic element like a ferrite core element, can be a component. Further examples for electronic components that can be embedded within or positioned upon a component carrier are data storage devices like a dynamic random access memory (DRAM), filters that can be configured for example as high-pass filter, low-pass filter or band-pass filter or that can be used as frequency filters. Also an integrated circuit (IC) like a so-called logic IC, any signal processing component like a microprocessor, any performance management component, any opto-electronic device, any voltage converter like DC/DC-converter or AC/DC-converter, any electromechanical converter like a lead-zirconium titanate (PZT)-sensor and/or -actor, as well as any sender unit or receiving unit for electromagnetic waves like a RFID-chip or -transponder, any cryptographic component, capacity, inductivity or switch like a transistor-based switch are comprised alone or combined with the aforementioned or together with other functional electronic components by the aforesaid term of a component or an electronic component, respectively. Furthermore the electronic component can also comprise a microelectromechanical system (short MEMS), a battery, an accumulator, a camera or an antenna. However, also other electronic components may be embedded in the electronic device. For example, a magnetic element can be used as an electronic component. Such a magnetic element may be a permanent magnetic element such as a ferromagnetic element, an antiferromagnetic element or a ferrimagnetic element, for instance a ferrite core, or may be a paramagnetic element. Such an electronic component may be surface-mounted on the component carrier and/or may be embedded in an interior thereof.

Furthermore one or several components may also be selected from a group consisting of an electrical non-conductive inlay, an electrical conductive inlay such as a metal inlay that preferably comprises copper or aluminium, and/or a heat transfer unit. Such a heat transfer unit may itself comprise for example at least one heat pipe, an electronic component or combinations thereof.

Also another task of the invention is to improve the heat management of a component carrier comprising a heat pipe with at least a largely cylindrical heat pipe section and to increase the heat absorption capability of the heat pipe.

The afore-mentioned objects are solved within the present invention by providing a component carrier according to the preamble of claim 1 with the features of the characterizing part of claim 1.

At a component carrier according to the invention that comprises at least one heat pipe, wherein the at least one heat pipe has at least a largely cylindrical heat pipe section with a largely cylindrical profile with an outer diameter, the at least one heat pipe is embedded within a recess of at least one inner layer or is surface-mounted on an outer layer of said component carrier, wherein at least the largely cylindrical heat pipe section of the heat pipe is thermoconductively coupled by at least one adapter means that directly contacts the heat pipe with at least one layer of the component carrier.

Advantageously a component carrier according to the invention comprises at least one adapter means to directly contact the heat pipe at least at their largely cylindrical heat pipe section. Thus at least the largely cylindrical heat pipe section of the heat pipe can be thermoconductively coupled by one or several adapter means with at least one layer of the component carrier. The adapter means fills in or bridges the gap or recess, respectively, between the neighbouring layers of the component carrier and the respective heat pipe. The heat management of said component carrier can be enhanced and also the heat absorption capability of the heat pipe can be improved by the at least one adapter means.

Advantageously the component carrier according to the invention can comprise at least one adapter means that at least partly encloses, preferably completely surrounds, the perimeter of the at least one largely cylindrical heat pipe section. In this embodiment of the invention the at least one adapter means can be made for example in one piece or in several pieces that each surround at least segments of the circumference of a heat pipe that either can be embedded within layers or can be surface-mounted on an outer layer of the component carrier.

Practically the component carrier can comprise at least one adapter means that extensively abuts on at least one planar layer of the component carrier. To enhance the heat absorption capability of the heat pipe the at least one adapter means provides an extensive, enlarged contact area in respect to one or several layers of the component carrier.

In a preferred embodiment of the invention the component carrier can comprise at least one adapter means that is positively connected and/or firmly bonded with the at least one largely cylindrical heat pipe section. The tighter the at least one adapter means is connected to or bonded with the heat pipe alongside at least its largely cylindrical heat pipe section, the more effective heat transfer between the heat pipe and layers of the component carrier is developed. To further enhance the heat absorption capability of the heat pipe the connection between the heat pipe and the adapter means can also be accomplished by means of firmly bonding like soldering, welding and/or gluing.

Advantageously the component carrier can have at least one adapter means that is made of a solid metal, preferably made of solid copper, direct bonded copper or an insulated metal substrate. In this preferred embodiment of the invention one or several solid adapter means are used that directly contact the heat pipe. This at least one adapter means can be made of thermoconductive material like a metal, metal alloy and/or a metal composite material with enhanced thermoconductive properties.

In a further advantageous embodiment of the invention the component carrier comprises at least one adapter means that is a solid adapter means made in one piece wherein an adapter through-hole is designed to receive at least one largely cylindrical heat pipe section and to surround the perimeter of said cylindrical heat pipe section. Advantageously in this embodiment the solid adapter means can receive in its adapter through-hole at least the cylindrical heat pipe section of the heat pipe. Thus by means of a preferably tight fit connection the heat pipe can be thermoconductively coupled with the surrounding solid adapter means.

Practically the component carrier can comprise at least one adapter means that is a solid adapter means made of several parts that are designed to go together and to jointly receive and surround the perimeter of the at least one cylindrical heat pipe section. In this embodiment the solid adapter means is advantageously made of several parts that can be joined together. Thus the adapter means can be easily arranged around the perimeter of the cylindrical heat pipe section.

According to an alternative embodiment of the invention the component carrier can comprise at least one adapter means that is a paste-like adapter means made of a sinter paste containing metal particles, preferably containing copper- and/or silver-particles. By means of a paste-like adapter means irregularities in the shape of the heat pipe can be easily overcome as the paste-like adapter means can compensate these irregularities or deformations, respectively, and thus ensures direct areal contact between at least a section of the heat pipe and at least one layer of the component carrier. Depending on the composition of the metal particles contained in the paste-like adapter means applied the thermal conductivity of the component carrier can be influenced. Preferably sinter pastes containing copper- and/or silver-particles are used that have enhanced thermoconductivity.

Advantageously a component carrier according to the invention can comprise at least one adapter means that is a resin-like adapter means provided by an excess of epoxy resin that is abundant within the only partially cured layers made of B-stage pre-preg material. In this embodiment the resin-like adapter means is stored as excess of epoxy resin within the only partially-cured pre-preg material. During lamination an excess of this resin-like adapter means passes out of this so-called B-stage pre-preg material and fills up gaps and recesses between the meanwhile cured layers of the component carrier and the heat pipe embedded.

The aforesaid tasks are also solved within the present invention by providing a method for producing said component carrier with at least one embedded heat pipe according to the features of claim 10.

A method for producing a component carrier according to the invention with at least one embedded heat pipe, comprises the following process steps:
—a—Providing at least one heat pipe that comprises at least a largely cylindrical heat pipe section with a largely cylindrical profile with an outer diameter;
—b—Optionally providing at least one solid adapter means that can be positively connected and/or firmly bonded with the at least one cylindrical heat pipe section in such a way to at least partly enclose, preferably completely surround, the perimeter of the at least one cylindrical heat pipe section;
and alternatively
—c—Providing at least one inner layer or a temporary carrier layer to position thereupon said at least one heat pipe;
—d—Embedding said at least one heat pipe by positioning at least one further inner layer flanking the at least one heat pipe and forming a recess in the shape of the outer contour of said at least one heat pipe, wherein if applicable the at least one solid adapter means is in contact with at least one inner layer;
or
—c'—Providing at least one inner layer with a recess in the shape of the outer contour of said at least one heat pipe;
—d'—Embedding said at least one heat pipe within the recess, wherein if applicable the at least one solid adapter means is in direct contact with at least one inner layer; and furthermore
—e—Optionally providing at least one paste-like adapter means to fill up the recess with the at least one embedded heat pipe;
—f—Attaching at least one further inner layer to cover the recess with the at least one embedded heat pipe;
—g—Optionally attaching outer layers on the recess or on the outsides of the already attached further inner layers covering the at least one embedded heat pipe;
—h—Laminating the at least one inner layer with the at least one embedded heat pipe and if applicable the attached outer layers, whereby if applicable an excess of epoxy resin that is abundant within only partially-cured layers of the component carrier is provided as resin-like adapter means to fill up the recess with the at least one embedded heat pipe, to receive a first semi-finished product;
—i—Optionally removing the temporary carrier layer;
—j—Arranging at least one opening from an outside surface of at least one outer layer to contact the at least one adapter means and/or the embedded heat pipe;
—k—Connecting the outer layers with the embedded heat pipe by means of thermal vias that are arranged in at least one opening.

Advantageously with the aforesaid inventive method at least one heat pipe can be embedded or arranged within a recess of one or several layers of the component carrier by using one or several solid adapter means and/or paste-like adapter means or using resin-like adapter means if only partially-cured layers containing an excess of epoxy resin are applied to form the component carrier. This production method provides high flexibility to apply one or several types of adapter means to thermoconductively couple at least sections of a largely cylindrical heat pipe with layers of the component carrier.

Advantageously the aforesaid method for producing a component carrier can be modified in a way that the at least one embedded heat pipe is fixed in place within the recess by adhesive means and after curing the adhesive a paste-like adapter means is applied on top of the heat pipe before at least one further layer is attached to cover the recess with the at least one embedded heat pipe. According to this method the heat pipe is fixed in place by an adhesive before an adapter means is applied. Thus the position of the heat pipe within a recess of the component carrier can be defined precisely.

Practically the inventive method for producing a component carrier can also be adapted in a way that, a recess with a therein embedded heat pipe is arranged, which recess is flanked by only partially-cured layers made of B-stage pre-preg material, and furthermore said recess is covered before lamination by another layer, preferably a pressure compensation layer made of a malleable material. According to this embodiment of an inventive method the application of resin-like adapter means that is stored as epoxy resin excess within the B-stage pre-preg material can be simplified. Due to the cover of the recess formed by another layer subsequent lamination can be performed without pressing the embedded heat pipe too tight. Thus unintended deformation of the heat pipe during lamination and pressing, respectively, can be avoided. Preferably a pressure compensation layer made of a malleable, plastic material is used to uniformly distribute the compressive stress during the lamination step.

In another embodiment of the invention a method for producing a component carrier with at least one surface-mounted heat pipe, can comprise the following process steps:
—a—Providing at least one heat pipe that comprises at least a largely cylindrical heat pipe section with a largely cylindrical profile with an outer diameter;
—b—Optionally providing at least one solid adapter means that can be positively connected and/or firmly bonded with the at least one cylindrical heat pipe section in such a way to at least partly enclose, preferably completely surround, the perimeter of the at least one largely cylindrical heat pipe section;
—c—Providing an outer layer to position thereupon said at least one heat pipe;
—d—Optionally providing at least one paste-like adapter means and positioning said paste-like adapter means on outside surface sections of the outer layer;
—e—Positioning of a centering template on the outer layer if applicable sideways of the paste-like adapter means on surface sections of the outer layer;
—f—Positioning of the at least one heat pipe, if applicable together with the solid adapter means connected therewith, by means of the centering template on the outer layer;
—g—Optionally fixing of the at least one heat pipe in place;
—h—Removing the centering template.

By means of a centering template also paste-like adapter means can be applied on surface sections of outer layers to surface-mount and thermoconductively connect heat pipes without contaminating the total outer layer area of the respective component carrier.

In yet another practical embodiment of the invention the method for producing a component carrier can comprise the following sequence of process steps that succeeds after removal of the centering template:
—i—Embedding said at least one heat pipe by positioning at least one further inner layer flanking the at least one heat pipe and forming a recess in the shape of the outer contour of said at least one heat pipe, wherein if applicable the at least one solid adapter means is in contact with at least one inner layer;
—j—Optionally providing at least one paste-like adapter means to fill up the recess with the at least one embedded heat pipe;
—k—Attaching at least one further inner layer to cover the recess with the at least one embedded heat pipe;
—l—Optionally attaching outer layers on the recess or on the outsides of the already attached further inner layers covering the at least one embedded heat pipe;
—m—Laminating the at least one inner layer with the at least one embedded heat pipe and if applicable the attached outer layers, whereby if applicable an excess of epoxy resin that is abundant within only partially-cured layers made of B-stage pre-preg material is provided as resin-like adapter means to fill up the recess with the at least one embedded heat pipe;
—n—Arranging at least one opening from an outside surface of at least one outer layer to contact the at least one adapter means and/or the embedded heat pipe;
—o—Connecting the outer layers with the embedded heat pipe by means of thermal vias that are arranged in at least one opening.

The aforesaid advantages of a component carrier apply equivalently also for an intermediate printed circuit board product, a PCB or an IC-circuit, as well as for the indicated methods for producing such a component carrier according to the invention.

FIG. 1 shows a detail of a heat pipe 20 with a largely cylindrical section 25 as well as a largely cylindrical profile 26 and an adapter means 30 that surrounds the heat pipe's cylindrical section 25. The adapter means 30 is here a solid adapter means 130 that is made of a single piece 131 and has a rectangular profile 133.

FIG. 2A shows a detail of a heat pipe 20 with an outer contour 21 having a largely cylindrical profile 26 and with cubical adapter means 30 that are solid adapter means 130 and are put on cylindrical sections 25 on both ends of the heat pipe 20. Both ends of the heat pipe 20 have cylindrical heat pipe sections 25 with an outer diameter 27 and a perimeter 28 that are positively connected with adapter through-holes 132 that are arranged within the single-piece solid adapter means 131.

FIG. 2B shows the heat pipe 20 according to FIG. 2A in a partially cross-sectional side view. In dotted lines the adapter through-holes 132 are depicted that positively take up the contour 21 of the respective cylindrical heat pipe sections 25. The solid adapter means 130 are made here of insulated metal substrate 139.

FIG. 3A shows in an exploded side view another embodiment of a solid adapter means 130 that is made of two separate parts 135 to surround the perimeter 28 of a heat pipe's 20 cylindrical profile 26. The solid adapter means 130 has in assembled position that is indicated by two arrows a rectangular profile 133. In assembled position the two separate parts 135 of the adapter means 30 are positive-locking in contact with the outer contour 21 and outer diameter 27, respectively, of the cylindrical heat pipe section 25 of the heat pipe 20. Thus the heat pipe 20 is directly and thermoconductively coupled with the parts 135 of the solid adapter means 130.

FIG. 3B shows in a side view a largely cylindrical heatpipe 20 having thermoconductive solid adapter means 130, mounted for instance by welding, that are here partially surrounding the heatpipe 20.

FIG. 3C shows a frontal view of the heatpipe 20 according to FIG. 3B, wherein the heatpipe 20 together with the solid adapter means 130 is placed within a recess of a core material 14, which recess is filled up with heat conductive material that functions as paste-like adapter means 230.

Figure 4:
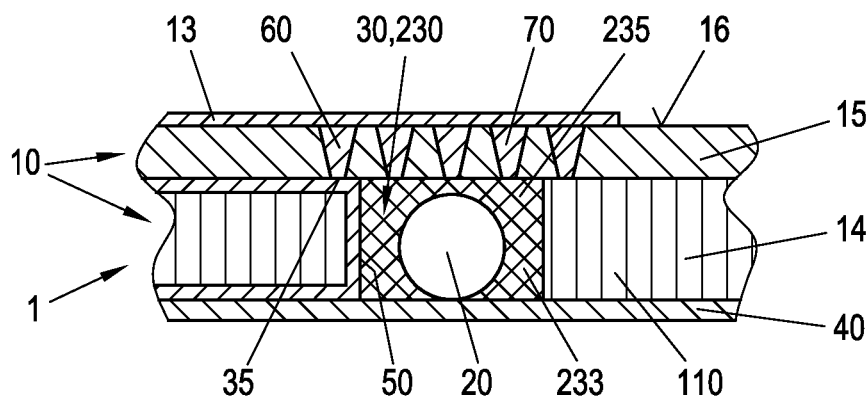
FIG. 4 depicts in a partial sectional side view a first embodiment of a component carrier according to the invention, wherein a heat pipe is embedded with a paste-like adapter means.

FIG. 4 depicts in a partial sectional side view a first embodiment of a component carrier 1 according to the invention, wherein a heat pipe 20 is embedded with an adapter means 30 that is here a paste-like adapter means 230. The component carrier 1 comprises several layers 10 like a core material 14 layer and an outer layer 15 that is here partly covered by a conducting metal layer 13 like a copper paste layer. The outer layer 15 is made here for example of FR4 composite material and also has an outer surface 16 area that is not covered by other layers. Here also a temporary carrier layer 40 is shown that might be required during manufacture of the component carrier 1 and can afterwards be removed again. As temporary carrier layer 40 for example UV tape can be taken. The core material 14 shows a recess 50 wherein the heat pipe 20 is embedded. Edges of the recess 50 may be plated via an edge plating layer 35. The outer conducting metal layer 13 is here thermally connected with the embedded heat pipe 20 via openings 60 that are arranged throughout the outer layer 15 and that are filled with thermal vias 70 and that are further on thermoconductively connected with the adapter means 30 surrounding the heat pipe 20. The adapter means 30 is a past-like adapter means 230 made of a sinter paste 235 that fulfils the here essentially rectangular profile 233 of the recess 50.

Figure 4A:
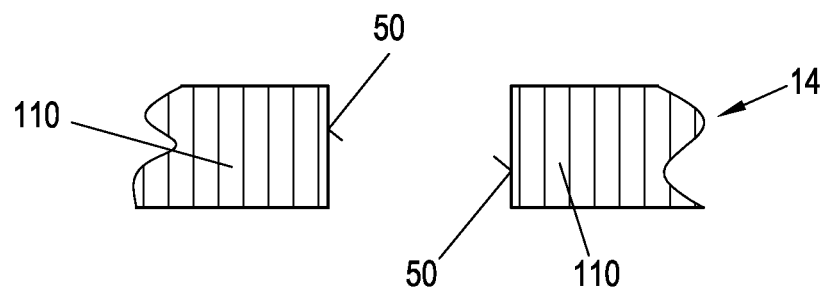
FIG. 4A and FIG. 4B each show in sectional side views manufacture steps how to receive the component carrier according to FIG. 4.
Figure 4B:
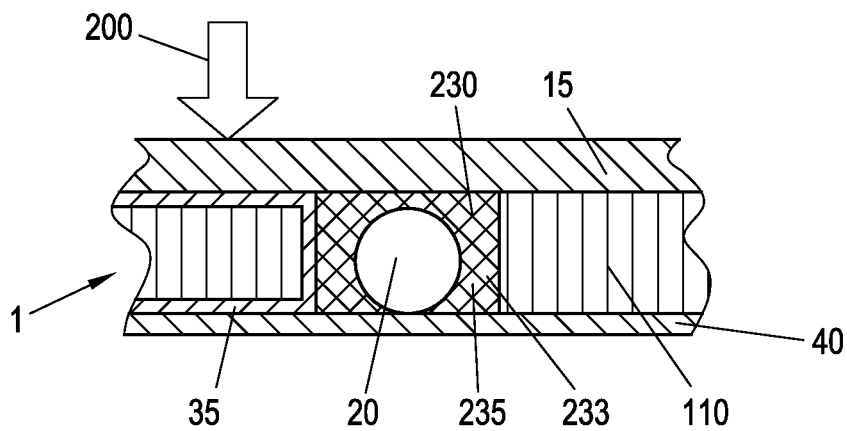

FIG. 4A and FIG. 4B each show in sectional side views manufacture steps how to receive the component carrier 1 according to FIG. 4. In FIG. 4A a core material 14 made of cured layers 110 of a so-called C-stage pre-preg material is depicted that has a recess 50. In FIG. 4B a temporary carrier layer 40 is placed below said core material 14 made of cured layers 110 to temporarily close the recess 50. A heat pipe 20 is embedded within the recess 50 that is closed to the bottom and the recess 50 is filled up with a paste a past-like adapter means 230 made of a sinter paste 235 that contains metal particles. Thus the essentially rectangular profile 233 of the recess 50 is filled up with the past-like adapter means 230 before the recess 50 is covered by an outer layer 15 that is made for example of FR4 laminate. Afterwards the layers 10 of the component carrier 1 are laminated via a lamination process that is indicated by means of arrow 200.

Figure 5:
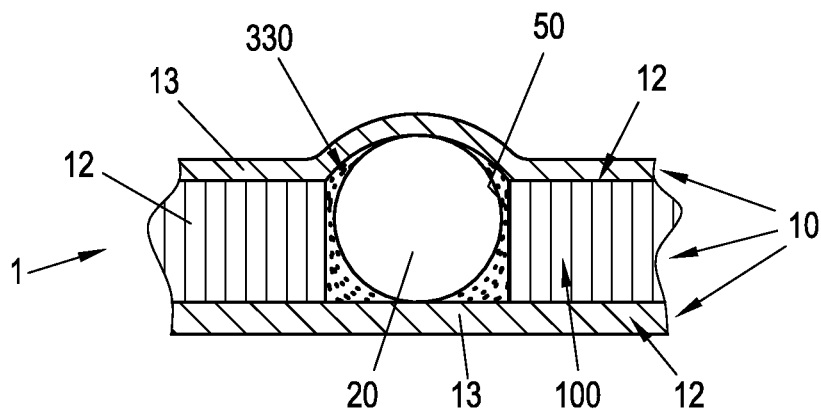
FIG. 5 depicts in a partial sectional side view a second embodiment of a component carrier according to the invention, wherein a heat pipe is embedded with a resin-like adapter means within only partially cured layers made of B-stage pre-preg material.

FIG. 5 depicts in a partial sectional side view a second embodiment of a component carrier 1 according to the invention, wherein a heat pipe 20 is embedded with a resin-like adapter means 330 within formerly only partially cured layers 100 made of B-stage pre-preg material. The component carrier 1 comprises several layers 10, whereby here an inner layer 12 that is made of a conducting metal layer 13 supports the embedded heat pipe 20 that is arranged within a recess 50 of a further inner layer 12. The recess 50 is filled up with resin-like adapter means 330 that is stored as excess resin within the only partially cured layers 100 and that passes out of the B-stage pre-preg material during the lamination process. Thus FIG. 5 shows the situation after laminating the layers 10 when the resin-like adapter means 330 already surrounds the heat pipe 20. As can be seen here in this example due to lamination the conducting metal layer 13 has been deformed because of the heat pipe 20 below and may contact the heat pipe 20 sectionally on its outer contour 21. Within the scope of the invention are also embodiments that are not explicitly shown wherein the embedded heat pipe 20 is surrounded by a resin-like adapter means 330 without touching the conducting metal layer 13. Thus in this case lamination is stopped at an earlier stage wherein the heat pipe 20 is not touched or in contact with the conducting metal layer 13.

FIG. 5A to FIG. 5F each illustrate in sectional side views manufacture steps how to receive the component carrier according to FIG. 5.

Figure 5A:
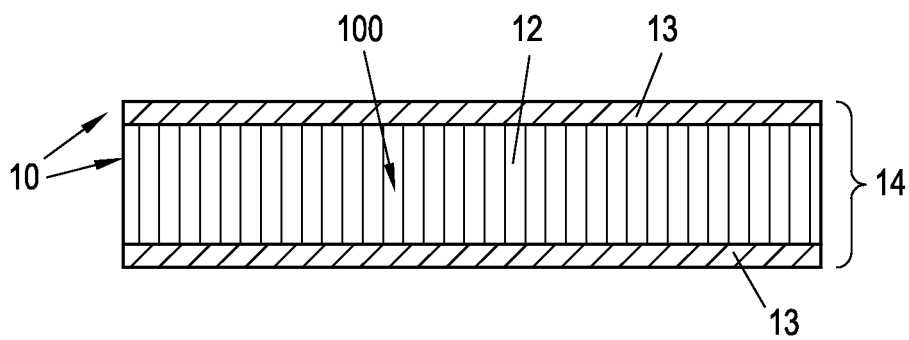
FIG. 5A to FIG. 5F each illustrate in sectional side views manufacture steps how to receive the component carrier according to FIG. 5.

Starting with FIG. 5A a core material 14 comprising one or several only partially cured layers 100 is shown. Within these partially cured layers 100 excess epoxy resin 335 is stored that may later on pass out of the B-stage pre-preg material during the lamination process. The one or several only partially cured layers 100 form at least an inner layer 12 that is on its outsides covered by conducting layers 13.

Figure 5B:
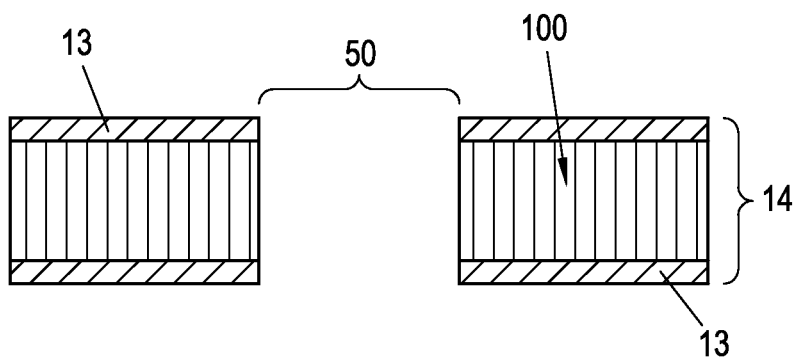

FIG. 5B shows the build-up as depicted in FIG. 5A after a slot-like recess 50 has been arranged that divides the core material 14.

Figure 5C:
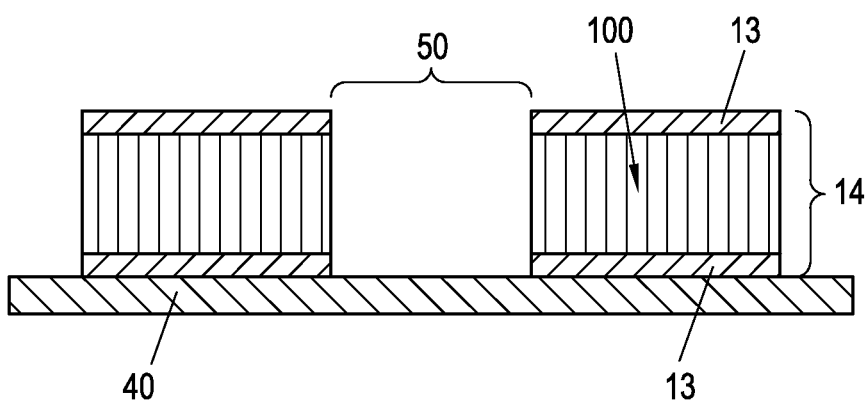
Figure 5D:
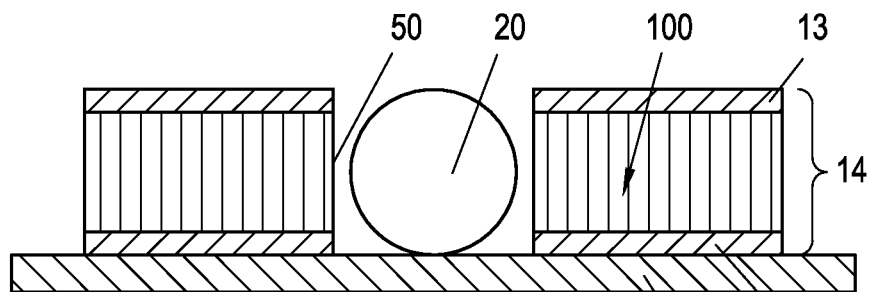

FIG. 5C shows the arrangement of FIG. 5B after being laid on a temporary carrier layer 40. Afterwards a heat pipe 20 is embedded within the recess 50 that is confined by the side walls of the cut-out core material 14 and the temporary carrier layer 40. This is shown in FIG. 5D.

Figure 5E:
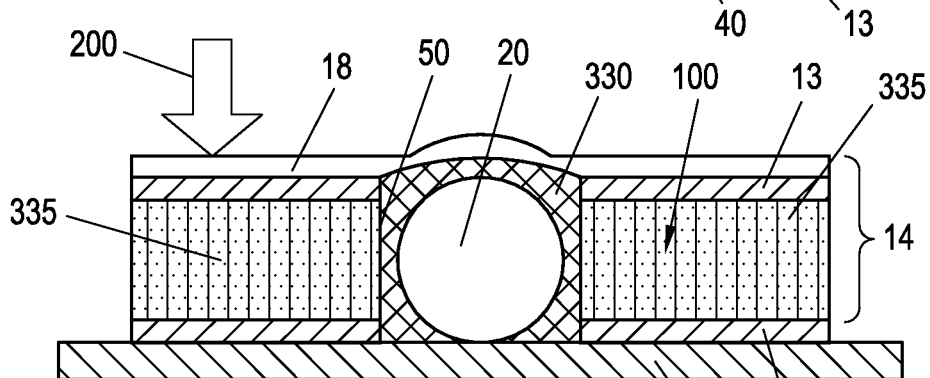

Next in FIG. 5E the recess 50 has been covered by a pressure compensation layer 18 that is made of a malleable, plastic material. Usage of a compensation layer 18 has proven advantageous during the lamination process 200 that is symbolized in FIG. 5E via an arrow 200. Due to the compensation layer 18 pressure stress is evenly distributed during lamination 200. The excess epoxy resin 335 that is stored within the only partially cured layers 100 exits during lamination 200 and fills up the recess 50 with resin-like adapter means 330 that adapts to the outer contour 21 of the cylindrical heat pipe section 25. Advantageously the deformable compensation layer 18 allows the recess 50 to be filled up overfull and allows the excess epoxy resin 335 to expand during lamination 200 to ensure full coverage of the heat pipe 20 even if heat pipes 20 with large outer diameters 27 are applied.

Figure 5F:
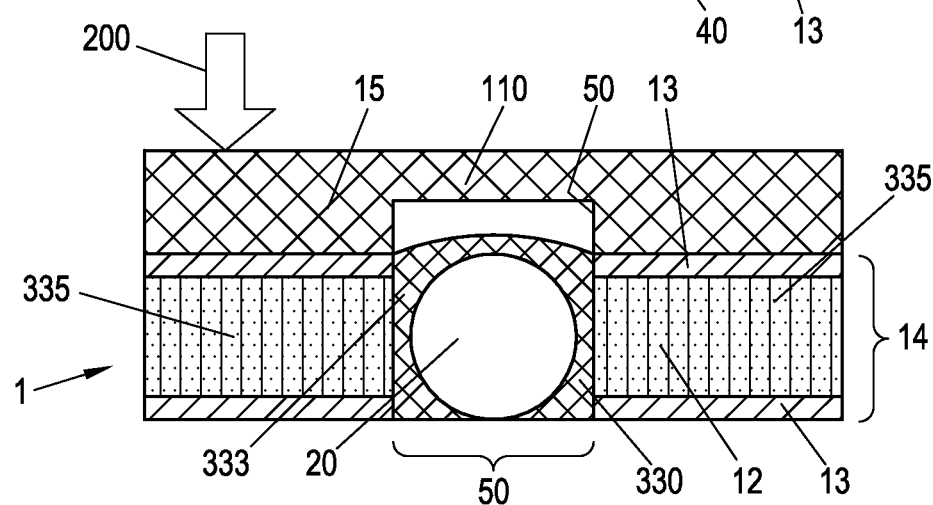

Further on FIG. 5F shows the component carrier 1 intermediate as depicted in FIG. 5E after compensation layer 18 as well as temporary carrier layer 40 have been taken off. On top of the meanwhile cured core material 14 as well as the cured resin-like adapter means 330 a cured layer 110 made of C-stage pre-preg material is placed that has here a recess 50 in the projection area above the embedded heat pipe 20. This arrangement is afterwards pressed again in another lamination step 200. Finally a component carrier 1 is manufactured that has an embedded heat pipe 20 arranged within an essentially rectangular profile 333 of a resin-like adapter means 330 that adapts the largely cylindrical shape 26 of the heat pipe 20 to the largely rectangular profile of the cut-out recess 50 in the core material 14.

Figure 6:
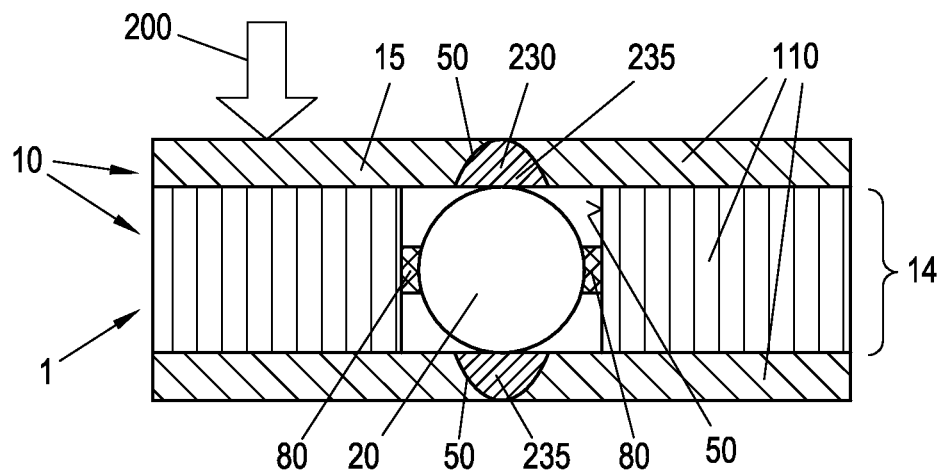
FIG. 6 depicts in a partial sectional side view a third embodiment of a component carrier according to the invention wherein a heat pipe is embedded with a sinter paste as paste-like adapter means within a center core material.

FIG. 6 depicts in a partial sectional side view another embodiment of a component carrier 1 according to the invention wherein a heat pipe 20 is embedded with a sinter paste 235 as paste-like adapter means 230 within a center core material 14. The component carrier 1 shown here comprises several layers 10 made of cured layer 110 material, so called C-stage pre-preg material 110. The embedded heat pipe 20 is fixed in place within the recess 50 by adhesive means 80 and after curing the adhesive the paste-like adapter means 30, 230 is applied on top of the heat pipe 20 before at least one further layer 10—here indicated as outer layer 15—is attached to cover the recess 50 with the embedded heat pipe 20. The covering outer layers 15 each have recesses 50 in the area next to the heat pipe 20 wherein the sinter paste 235 is arranged. Via a subsequent lamination process 200 these sinter paste 235 depots are distributed into the recess 50 with the heat pipe 20 embedded to thermoconductively couple the heat pipe 20 with the outer layers 15. For example a silver-based sinter paste 235 can be used in this embodiment.

Figure 7:
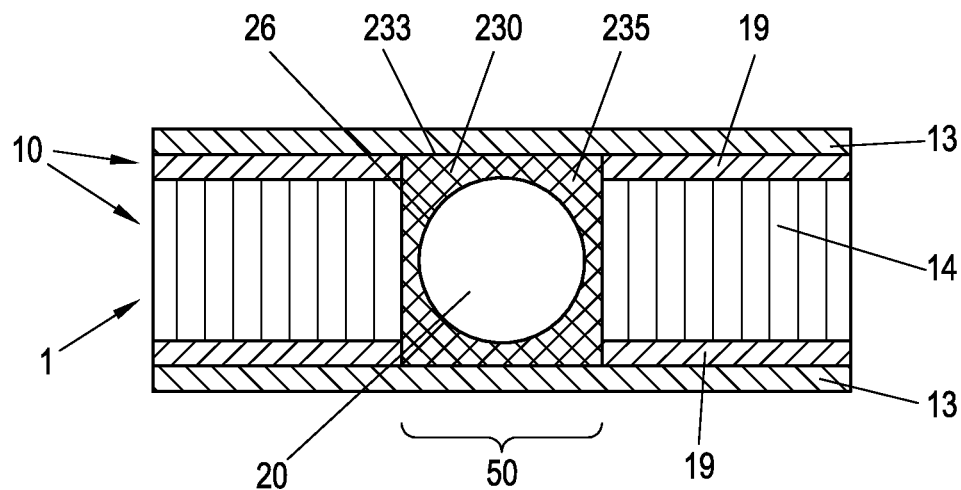
FIG. 7 shows in a cross-sectional side view a fourth embodiment of a component carrier according to the invention with a heat pipe embedded with a sinter paste as paste-like adapter means within a milling groove of a core material.

FIG. 7 shows in a cross-sectional side view another embodiment of a component carrier 1 according to the invention with a heat pipe 20 embedded within a sinter paste 235 as paste-like adapter means 230 within a recess 50. The recess 50 is prepared as milling groove within a core material 14. The core material 14 is arranged between so-called no-flow pre-preg layers 19 that work as heat-distributing layers for conducting layers 13 that are attached at the outsides of the no-flow pre-preg layers 19.

Figure 8:
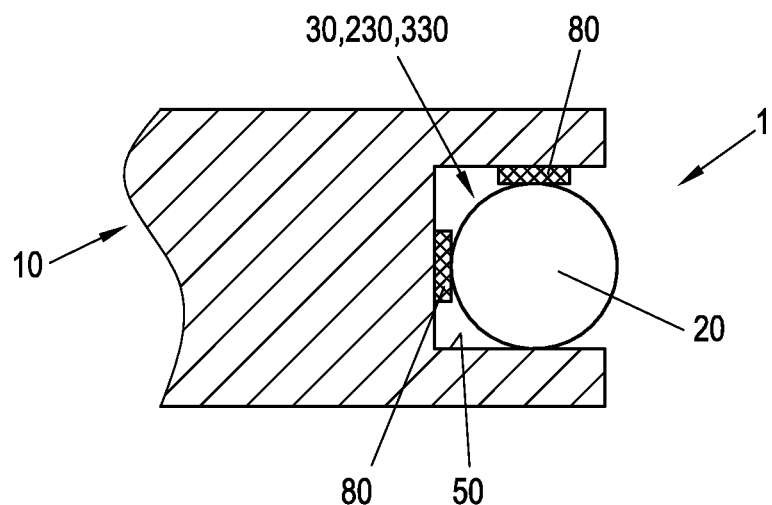
FIG. 8 depicts in a cross-sectional side view a detail of a fifth embodiment of a component carrier according to the invention, with a heat pipe adhered within a groove arranged along the side edge of the component carrier and before embedding by adapter means such as paste-like adapter means or resin-like adapter means.

FIG. 8 depicts in a cross-sectional side view a detail of a fifth embodiment of a component carrier 1 according to the invention, with a heat pipe 20 adhered within a groove-like recess 50 arranged along the side edge of a layer 10 of the component carrier 1. Advantageously by this arrangement no additional space is consumed by the heat pipe 20 within the main area of the component carrier 1. The heat pipe 20 is here shown fixed in place within the recess 50 by adhesive means 80 and before embedding by adapter means 30 such as paste-like adapter means 230 or resin-like adapter means 330.

Figure 9:
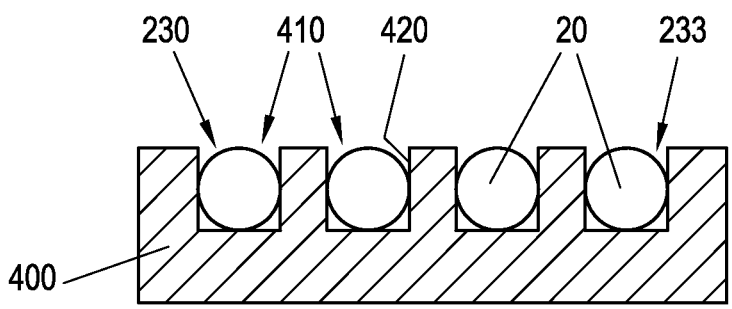
FIG. 9 shows in a cross-sectional side view a mould with several grooves and heat pipes that are placed within said grooves before being embedded by paste-like adapter means.

FIG. 9 shows in a cross-sectional side view a mould 400 with several grooves 410 and heat pipes 20 that are placed within said grooves 410 before being embedded by paste-like adapter means 230. Largely cylindrical heat pipes 20 can be placed within the grooves 410 of the mould 400 which is for example made of silicone. Afterwards the heat pipes 20 can be molded together with a past-like adapter means 230 like a copper paste in order to receive a rectangular profile 233 of the sinter paste 235 in accordance with the respective rectangular profile 420 of the groove 410. Advantageously these cylindrical heat pipes 20 with now largely rectangular profile 233 can be prepared as pre-process and can easily be connected for example via laser vias.

Figure 10:
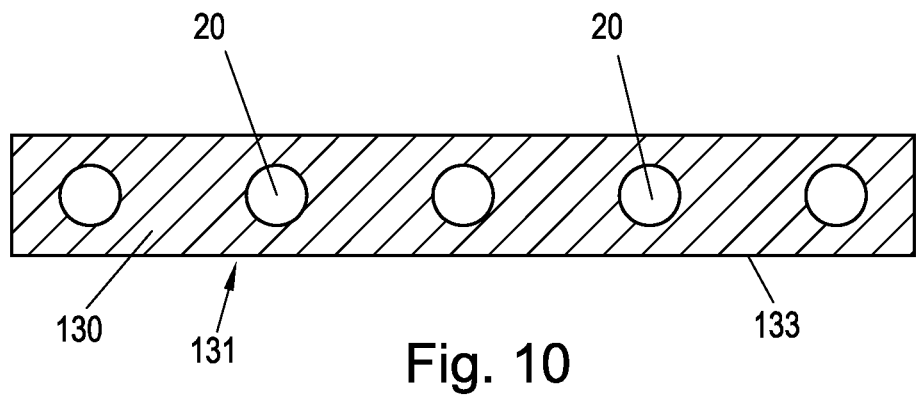
FIG. 10 displays in a cross-sectional side view several heat pipes arranged side by side, preferably in parallel that are embedded within a solid adapter means.

FIG. 10 displays in a cross-sectional side view several heat pipes 20 arranged side by side, preferably in parallel that are embedded within a solid adapter means 130. As solid adapter means 130 for example a single-piece solid adapter means 131 made of solid copper is used. Advantageously heat pipes 20 that are arranged side by side at lower space requirement can transport more heat and have in total a higher heat capacity than separately arranged single heat pipes. The solid adapter means 130 provides a compact rectangular profile 133.

Figure 11:
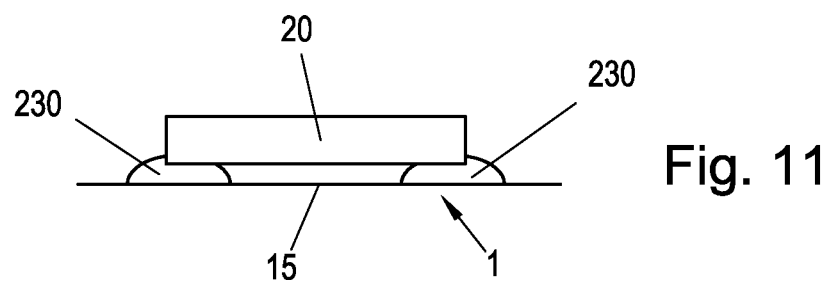
FIG. 11 depicts in a side view a detail of a sixth embodiment of a component carrier according to the invention, wherein a heat pipe is surface-mounted with a paste-like adapter means on a surface layer of the component carrier.

FIG. 11 depicts in a side view a detail of a sixth embodiment of a component carrier 1 according to the invention, wherein a heat pipe 20 is surface-mounted with a paste-like adapter means 230 on an outer layer 15 of the component carrier 1.

Figure 11A:
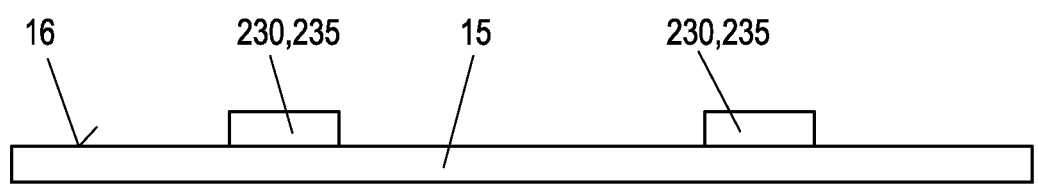
FIG. 11A to FIG. 11C each show in sectional side views manufacture steps how to surface-mount the heat pipe shown in FIG. 11 with the help of a centering template.
Figure 11B:
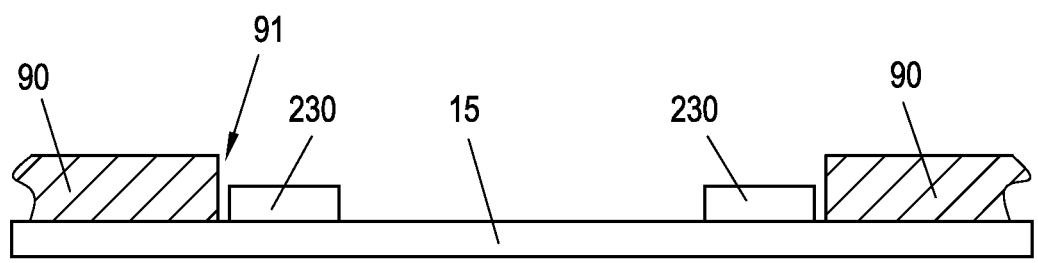
Figure 11C:
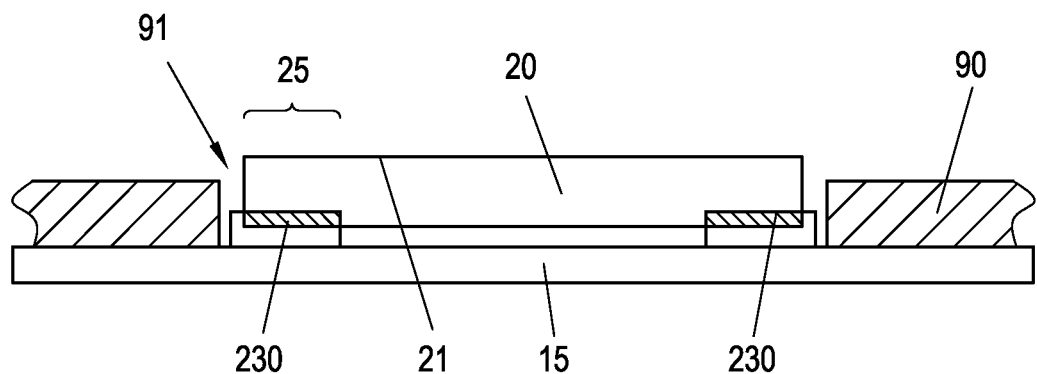

FIG. 11A to FIG. 11C each show in sectional side views manufacture steps how to surface-mount the heat pipe 20 shown in FIG. 11 with the help of a centering template 90.

FIG. 11A shows the outer layer 15 with traces of paste-like adapter means 230 like a sinter paste 235 being arranged on top of the surface 16 of the outer layer 15.

FIG. 11B shows that a centering template 90 is located in a way atop of the planar surface 11 of the outer layer 15 that a recess 91 within the centering template 91 that has the contour 21 of the heat pipe 20 is arranged according the positions of the adapter means 230 applied.

FIG. 11C shows the centering template 90 located on top of the outer layer 15 wherein a heat pipe 20 is arranged within the recess 91 of the centering template 91. The largely cylindrical heat pipe sections 25 are at least partly embedded within the paste-like adapter means 230. Advantageously can be seen that in this embodiment also largely cylindrical heat pipes 20 that are deformed or have irregularities can be used to be surface-mounted onto a surface section 17 of an outer layer 15 the component carrier 1.

Figure 11D:
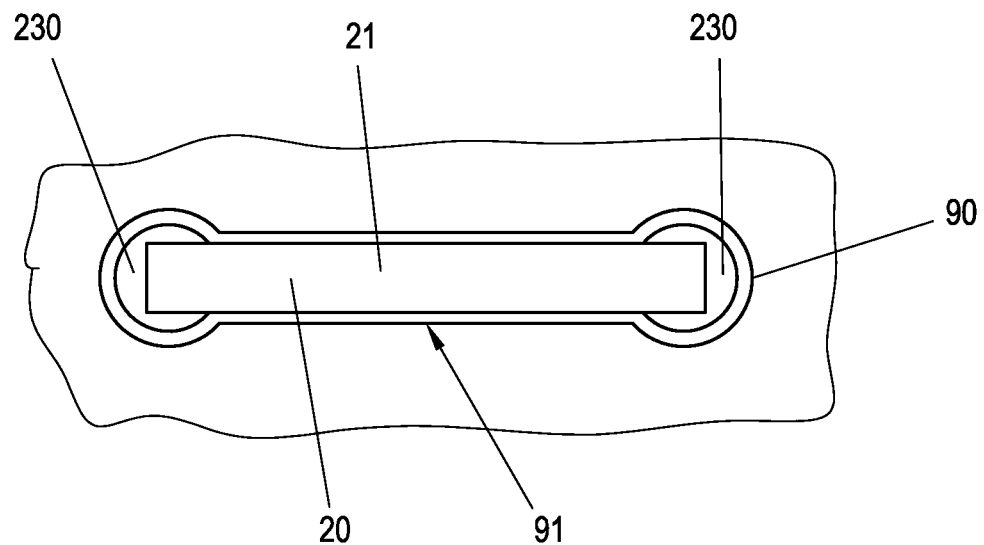
FIG. 11D shows a detail of the arrangement as depicted in FIG. 11C in a top view, wherein the already surface-mounted heat pipe is still arranged within a recess of the centering template.

FIG. 11D shows a detail of the arrangement as depicted in FIG. 11C in a top view, wherein the already surface-mounted heat pipe 20 is still arranged within a recess 91 of the centering template 20.

The invention claimed is:

1. A component carrier comprising:
a component carrier body having at least at least one inner layer and at least one outer layer;
at least one heat pipe, wherein the at least one heat pipe has at least a largely cylindrical heat pipe section with a largely cylindrical profile with an outer diameter;
wherein the at least one heat pipe is associated with said component carrier body by a means chosen from the group consisting of: embedded within a recess of the at least one inner layer of said component carrier body, and surface-mounted on the at least one outer layer of said component carrier body; and
wherein at least the largely cylindrical heat pipe section of the heat pipe is thermoconductively coupled by at least one paste-like adapter that directly contacts the heat pipe with the at least one inner or outer layer of the component carrier body.

2. The component carrier of claim 1, wherein the at least one adapter at least partly encloses, the perimeter of the at least one largely cylindrical heat pipe section of the at least one heat pipe.

3. The component carrier of claim 1, wherein the adapter abuts on the at least one layer of the component carrier, and wherein the at least one layer is planar.

4. The component carrier of claim 1, wherein the at least one adapter is at least one of positively connected or firmly bonded with the at least one largely cylindrical heat pipe section.

5. The component carrier of claim 1, wherein the at least one paste-like adapter is formed of a sinter paste containing metal particles.

6. A component carrier comprising:
a component carrier body comprising at least one inner layer formed of a partially-cured ore-preg material comprising an excess of epoxy resin;
at least one heat pipe, wherein the at least one heat pipe has at least a largely cylindrical heat pipe section with a largely cylindrical profile with an outer diameter;
wherein the at least one heat pipe is embedded within a recess of the at least one inner layer of said component carrier body;
wherein at least the largely cylindrical heat pipe section of the heat pipe is thermoconductively coupled to the at least one inner layer by a resin-like adapter that directly contacts the heat pipe with the at least one inner layer of the component carrier body; and
where said resin-like adapter is formed of the excess resin of the at least one inner layer.

7. A method for producing a component carrier with at least one embedded heat pipe, comprising:
providing at least one heat pipe that comprises at least a largely cylindrical heat pipe section with a largely cylindrical profile with an outer diameter and defining an outer contour;
providing at least one carrier body comprising at least a first inner layer formed of a partially-cured pre-preg material having an excess of epoxy resin disposed therein, and at least one outer layer;
forming a recess within the at least first inner layer of the carrier body in the shape of the outer contour of the at least one heat pipe;
providing at least one additional layer to position said at least one heat pipe on, wherein the at least one additional layer is chosen from the group consisting of a second inner layer of the carrier body and a removable temporary carrier layer;
positioning said at least one heat pipe on the at least one additional layer within the recess formed within the first inner layer;

attaching at least one further layer to cover the recess within which the at least one heat pipe is embedded;

laminating the component carrier by applying pressure to the at least one further layer such that the excess epoxy resin within the at least first inner layer of the component carrier such that the excess epoxy resin fills up the recess with the at least one heat pipe embedded therein to form at least one resin-like adapter thermoconductively coupling and directly contacting the at least one heat pipe with the at least first inner layer of the at least one component carrier body;

arranging at least one opening from an outside surface of the at least one outer layer of the component carrier body to contact at least one of the at least one resin-like adapter or the at least one embedded heat pipe; and connecting the at least one outer layer with the at least one embedded heat pipe by means of a plurality of thermal vias arranged in the at least one opening.

8. The method for producing a component carrier of claim 7, wherein the at least one embedded heat pipe is fixed in place within the recess by an adhesive and after curing the adhesive a paste-like adapter is applied on top of the heat pipe before at least one further layer is attached to cover the recess with the at least one embedded heat pipe.

9. The method for producing a component carrier of claim 7, wherein the further layer is a pressure compensation layer formed of a malleable material.

10. The component carrier of claim 2, wherein the at least one adapter completely surrounds the perimeter of the at least one largely cylindrical heat pipe section.

11. The component carrier of claim 5, wherein the metal particles are chosen from a group consisting of copper particles, silver particles, and a mixture comprising copper and silver particles.

12. A method for producing a component carrier with at least one embedded heat pipe, comprising:

providing at least one heat pipe that comprises at least a largely cylindrical heat pipe section with a largely cylindrical profile with an outer diameter and defining an outer contour;

providing at least one carrier body comprising at least a first inner layer and at least an outer layer;

forming a recess within the at least first inner layer of the carrier body in the shape of the outer contour of the at least one heat pipe;

providing at least one additional layer to position said at least one heat pipe on, wherein the at least one additional layer is chosen from the group consisting of a second inner layer of the carrier body and a removable temporary carrier layer;

positioning said at least one heat pipe on the at least one additional layer within the recess formed within the first inner layer;

providing at least one solid adapter that can be at least one of positively connected or firmly bonded with the at least one largely cylindrical heat pipe section in such a way to at least partly enclose the perimeter of the at least one largely cylindrical heat pipe section, wherein the at least one solid adapter is in contact with the at least first inner layer;

providing at least one paste-like material to fill up the recess with the at least one embedded heat pipe to form a paste-like adapter thermoconductively coupling and directly contacting the at least one heat pipe with the at least first inner layer of the at least one component carrier body; and attaching at least one outer layer on the recess to thereby cover the at least one embedded heat pipe.

\* \* \* \* \*